United States Patent [19]

Asano et al.

[11] Patent Number: 5,145,829
[45] Date of Patent: Sep. 8, 1992

[54] METHOD FOR MANUFACTURING OXIDE HIGH-TEMPERATURE SUPERCONDUCTOR

[75] Inventors: Toshihisa Asano; Yoshiaki Tanaka; Masao Fukutomi; Hiroshi Maeda, all of Tsukuba, all of Japan

[73] Assignee: National Research Institute for Metals, Tokyo, Japan

[21] Appl. No.: 396,620

[22] Filed: Aug. 22, 1989

[30] Foreign Application Priority Data

Aug. 26, 1988 [JP] Japan ................... 63-210583

[51] Int. Cl.$^5$ .............................................. H01L 39/12
[52] U.S. Cl. ................................. 505/1; 264/65; 264/66; 264/239; 264/240; 505/739; 505/740
[58] Field of Search .................. 264/63, 66, 65, 239, 264/294, 240; 505/704, 739, 740, 782, 1

[56] References Cited

U.S. PATENT DOCUMENTS 4,906,609  3/1990  Yamauchi et al. ................. 505/1

OTHER PUBLICATIONS

Yamada et al. "Pb–Introduction to the High-$T_c$ Superconductor Bi–Sr–Ca–Cu–O" *Jap. Journ. App. Phys.* Jun. 1988.

Asano et al. "Preparation of Highly Oriented Microstructure in the (Bi, Pb)–SR–CA–CU–O Sintered Oxide Superconductor" *Jap Jour App Phys* (Sep., '88).

Tanaka et al. "Improvements in the Current Carrying Capacity in High-$T_c$ BiSRCACuO Superconductors" *Jap Journ App Phys* (Sep. '88).

Mimura et al. "Improvement of the Critical Current Density in the Silver Sheathed Bi–PB–SR–CA–CU–O Superconducting Tape," *App Phys Lett* (Apr. 1989).

Sadakata et al, "Fabrication and Superconducting Properties of High $T_c$ Oxide Wire", *Matls. Research Soc. Symposium Proceedings* (Dec. 1987).

Takano et al., "High $T_c$ Phase Promoted and Stabilized in the Bi–PB–SR–Ca–Cu–O System," *Jap Journ of App Phys* (Jun. 1988).

Sherwood et al. "Superconducting Properties of $YBA_2Cu_3O_{7-\delta}$ Doped with Various Metals and Oxides," *Matls. Research Soc. Symposium* vol. 99 (Dec. 1987).

*Primary Examiner*—James Lowe
*Assistant Examiner*—Christopher A. Fiorilla
*Attorney, Agent, or Firm*—Wenderoth, Lind & Ponack

[57] ABSTRACT

A compacted and highly oriented microstructure of the bulk-shaped Bi-Sr-Ca-Cu-O system oxide superconductor is obtained by the intermediate pressing method of the present invention. The growth rate of the high critical temperature phase in the bulk of Pb-doped Bi-Sr-Ca-Cu-O system oxide superconductor is also much improved and the sintering duration for obtaining a single phase having a high critical temperature is shorteneed by this method. Additionally, a higher critcal current density of Bi-Sr-Ca-Cu-O system oxide superconductor is obtained by the working under pressure process after cooling between a first and second sintering step. Furthermore, the magnetic field dependence of the critical current density of Bi-Sr-Ca-Cu-O system oxide superconductor is also improved by the method of the present invention. The thus intermediate pressing process between the first and second sintering step of the present invention may be applied so easily as to facilitate the manufacture of tapes, wires, discs or the like of the Bi-Sr-Ca-Cu-O system oxide superconductor.

13 Claims, 2 Drawing Sheets

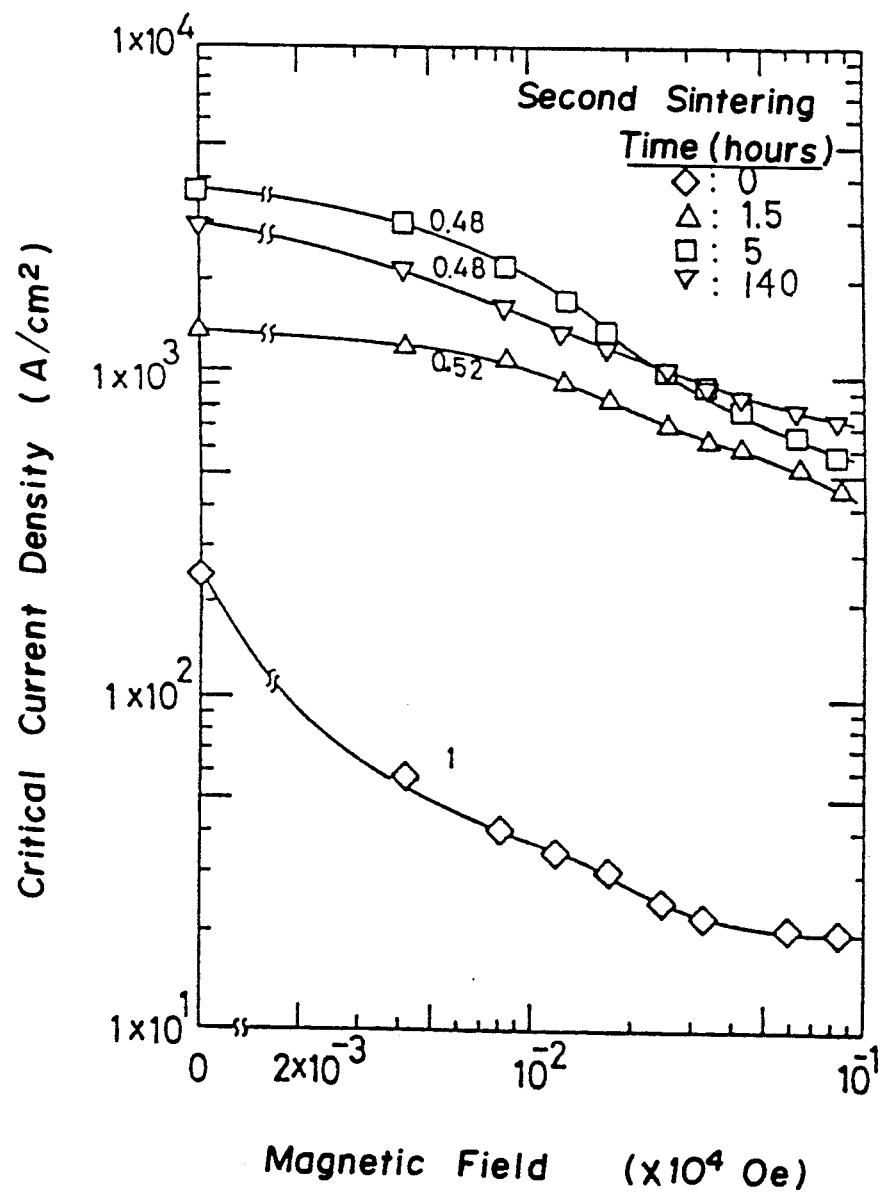

METHOD FOR MANUFACTURING OXIDE HIGH-TEMPERATURE SUPERCONDUCTOR

FIELD OF THE INVENTION

The present invention relates to a method for manufacturing an oxide high-temperature superconductor. More particularly, the present invention relates to a novel method for manufacturing an oxide high-temperature superconductor, which permits the manufacture of a Bi-Sr-Ca-Cu-O system superconductor having a high-density sintered microstructure comprising c-axis highly oriented crystal grains and a high critical current value.

PRIOR ART

Expansion of the scope of application of oxide high-temperature superconductors is expected in a wide area of use ranging from strong electrical uses, such as wires, tape-shaped products, and thin films for a superconductive magnet for a high magnetic field and superconductive power transmission, to weak electrical uses such as for wiring on electronic substrates and as magnetic shielding materials or the like.

The three principal systems of such oxide high-temperature superconductors already discovered include the YBaCuO system, the BiSrCaCuO system, and the TlBaCaCuO system and are considered to have a very high practical usefulness because of the availability at a temperature higher than the temperature of liquid nitrogen.

For the Bi-Sr-Ca-Cu-O system oxide high-temperature superconductors, the critical temperature (Tc) is over 100K and such superconductors do not have as high a toxicity as the Tl-Ba-Ca-Cu-O oxide system superconductors. The Bi-Sr-Ca-Cu-O material therefore represents the most hopeful material, and active studies are being carried out for practical applications thereof.

Until recently, it had been difficult to control the low-temperature phase covering the critical temperature up to 80K and the high-temperature phase covering the critical temperature up to 110K for these Bi-Sr-Ca-Cu-O system oxide superconductors. However, methods have been found to synthesize oxide superconductors substantially comprising an exclusively high-temperature phase by replacing part of bismuth with lead.

However, for the Bi-Sr-Ca-Cu-O system superconductors, which are contemplated in practical application, the problem of such materials exhibiting a very low critical current density at a high critical temperature, which is an important use, is still left unsolved, when the material is in a bulky shape other than a thin film.

OBJECT OF THE INVENTION

The present invention was developed in view of the above-mentioned circumstances, and an object of the invention is to overcome the defects in the conventional Bi-Sr-Ca-Cu-O system oxide high-temperature superconductors, and thus to provide a novel method for manufacturing a Bi-Sr-Ca-Cu-O system oxide high-temperature superconductor, which permits a remarkable improvement in the critical current density (Jc).

This and other objects of the invention will become apparent in the detailed description and examples which follow.

BRIEF DESCRIPTION OF THE DRAWINGS

FIG. 3 is a correlation diaphragm illustrating critical current density changes of an oxide high-temperature superconductor manufactured by the method of the present invention, with a magnetic field.

DETAILED DESCRIPTION OF THE INVENTION

Figure 1:
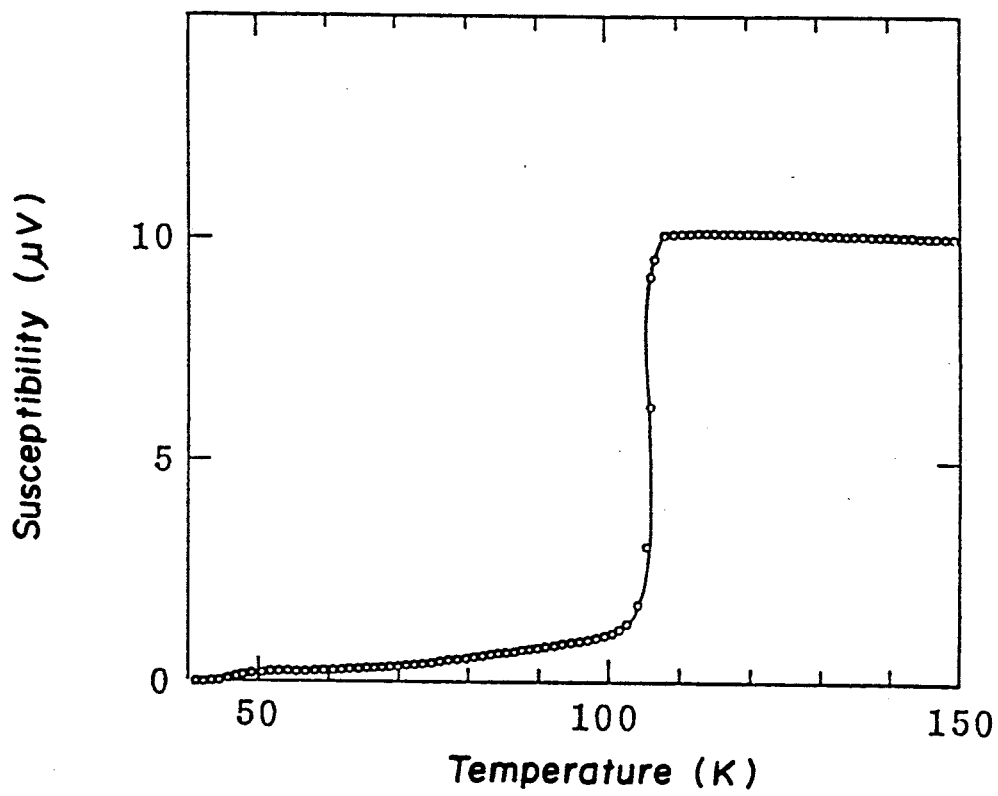
FIGS. 1 and 2 are correlation diaphragms illustrating the AC magnetic susceptibility change and the electric resistance change of an oxide high-temperature superconductor manufactured by the method of the present invention, with temperature.

The present invention provides a method for manufacturing an oxide high-temperature superconductor having a highly oriented microstructure, which comprises the steps of adding lead to a raw material powder containing bismuth, strontium, calcium, copper and oxygen; mixing, calcining and forming the mixture; sintering the resultant formed product; then cooling said formed product, working the resultant sinter under pressure for compressing said sinter in the direction of a single axis thereof, and then sintering again the thus worked sinter, in a mixed gas atmosphere having an oxygen partial pressure of from 1 to 1/20 atm, with an inert gas such as nitrogen gas, argon gas or helium gas.

In the present invention, oxides and salts of the elements composing the raw material powder are mixed. It is generally desirable to mix these oxides and salts in an atomic ratio of Bi:Sr:Ca:Cu=from 0.6 to 1.0:1.0:from 1.0 to 1.5:from 1.5 to 2.5, and the amount of added lead should preferably have an atomic ratio of from 0.05 to 1.0. It is needless to mention that these ratio are not limitative. More preferably, the atomic ratio should be Pb:Bi:Sr:Ca:Cu=0.3:0.7:1.0:1.5:2.0. This ratio is based on the finding that the stoichiometric ratio for the high-temperature phase giving a critical temperature (Tc) up to 110K of a Bi-Sr-Ca-Cu-O system oxide superconductor has substantially been established with an atomic proportion of Bi:Sr:Ca:Cu=1:1:1:1.5, and a large variation from this ratio may produce a low-temperature phase giving a critical temperature (Tc) up to 80K.

In the present invention, the mixed powder of the raw materials and the additives is calcined, and then formed into a prescribed shape. There is no particular limitation on the shape of the formed product made from the crushed product after calcination: forming may be into any of pellets, wires, tape-shaped products or the like. Any of the conventional methods including the compression forming may be appropriately adopted for forming.

This formed product is then initially sintered(first sintering), and after cooling, worked under pressure, and sintered again(second sintering).

The heat treatment temperature in the first and the second sintering should be within the temperature range in which the solid reaction is accelerated and complete melting never occurs, and an optimum heat treatment temperature should be appropriately selected in response to an arbitrary atmosphere. There is no particular limitation for the atmosphere for this purpose: air or any of various mixed gases of various oxygen partial pressures which are selected from the aforementioned pressure of from 1 to 1/20 atm, may be appropriately used.

Usually, the first sintering should preferably be carried out at a temperature of from 780° to 890° C. for a period of from about half of a day to 20 days, and more preferably, for example, at 845° C. for three days.

The second sintering should preferably be carried out at the same temperature as at the first sintering and for a period of from an hour and a half to 20 days.

When adding silver, silicon or boron, in addition to lead, to the raw material powder for the mixture, it is possible to further reduce the sintering temperature.

Furthermore, by adding cadmium or sulfur to the raw material powder for the mixture, the critical current density (Jc) under a high magnetic field is improved.

One of the features of the method of the present invention is to work under pressure the formed product after cooling between the first and second sintering steps. This is indispensable for overcoming the density of the crystal microstructure and the high anisotropy considered to be the causes of a low critical current density, which is a defect of the conventional Bi-Sr-Ca-Cu-O system oxide high-temperature superconductors. More specifically, the working under pressure adjusts the a-b faces of the crystal grains forming the current flow, thus converting them into c-axis highly oriented crystal grains and permitting achievement of a higher density.

For the working under pressure, any of the conventional methods such as pressing, HIP, CIP, roll swaging, or the like may be appropriately used, and the pressure may be from a few tons to about 20 ton/3.14 cm$^2$, or may be even higher as required. The working under pressure should preferably be carried out at the time when the diffusion reaction proceeds to some extent under the effect of heat treatment, and a sheet-shaped sintered microstructure has been formed.

The repetition, twice or more, of the steps comprising the first sintering, the working under pressure and the second sintering is effective for further improving the critical current density (Jc).

The present invention eliminates the necessity of a long heat treatment conventionally required for increasing the volumic ratio of the high temperature phase for a Bi-Sr-Ca-Cu-O system oxide superconductor and eliminates the tailing of the superconducting transition curve caused by the mixture of the low temperature phase, and thus reduces the heat treatment time to from one fourth to one third as compared with the time conventionally required.

It is possible to obtain an oxide high-temperature superconductor having a dense microstructure and a c-axis highly oriented crystal microstructure, with a critical current density (Jc) value ten times as high as the conventional one.

As it is possible, furthermore, to easily apply the manufacturing method of the present invention into the manufacture of tapes, wires or the like, it becomes possible to expand the scope of applications of the oxide high-temperature superconductor.

Now, the present invention is described further in detail by means of examples.

EXAMPLES 1 TO 7

$Bi_2O_3$ powder, $SrCO_3$ powder, $CaCO_3$ powder, CuO powder and $Pb_3O_4$ powder were prepared into the atomic ratio as shown in Table 1 and were sufficiently mixed. Each of the resultant seven samples (corresponding to the Examples 1 to 7) of raw material powder was calcined at 800° C. for ten hours and crushed. This process was repeated twice. The respective powder thus obtained was compressed and formed under a pressure of 16 ton/3.14 cm$^2$, at room temperature, into pellets each having a diameter of 2 cm and a thickness of 1 mm. Each of the pellets was subjected to a first sintering under the respective heat conditions shown in Table 2. After the first sintering, each of the pellets was, in the shape as it was, pressurized and compressed under 16 ton/3.14 cm$^2$ after cooling to room temperature. Subsequently, the second sintering was applied under the respective heat treatment conditions shown in Table 2, and each of the resultant pellets was cooled in the furnace.

A test piece was cut from each of the thus obtained pellets, and the superconducting start point (Tc) based on the AC magnetic susceptibility method, the transition width (ΔTc) and the critical current density (Jc) in liquid nitrogen were measured. The results are shown in Table 2.

TABLE 1

| Example | Pb | Bi | Sr | Ca | Cu |
| --- | --- | --- | --- | --- | --- |
| 1 to 3 | 0.15 | 0.8 | 1.0 | 1.0 | 2.0 |
| 4 and 5 | 0.3 | 0.7 | 1.0 | 1.5 | 2.0 |
| 6 and 7 | 0.9 | 1.0 | 1.0 | 1.5 | 2.5 |

TABLE 2

| Example | First sintering (°C. × days) | Intermediate pressurizing (ton/3.14 cm$^2$) | Second sintering (°C. × days) | Tc (K) | ΔTc (K) | Jc (A/cm$^2$) |
| --- | --- | --- | --- | --- | --- | --- |
| 1 | 840 × 1 | 16 | 840 × 6 | 107 | 6 | 450 |
| 2 | 850 × 4 | 16 | 840 × 2 | 109 | 4 | 600 |
| 3 | 845 × 2 | 16 | 845 × 10 | 109 | 3 | 720 |
| 4 | 845 × 2 | 16 | 845 × 10 | 109 | 4 | 685 |
| 5 | 845 × 2 | 16 | 845 × 10 | 109 | 4 | 690 |
| 6 | 845 × 2 | 16 | 845 × 10 | 108 | 3 | 650 |
| 7 | 845 × 2 | 16 | 845 × 10 | 110 | 4 | 710 |

Figure 2:
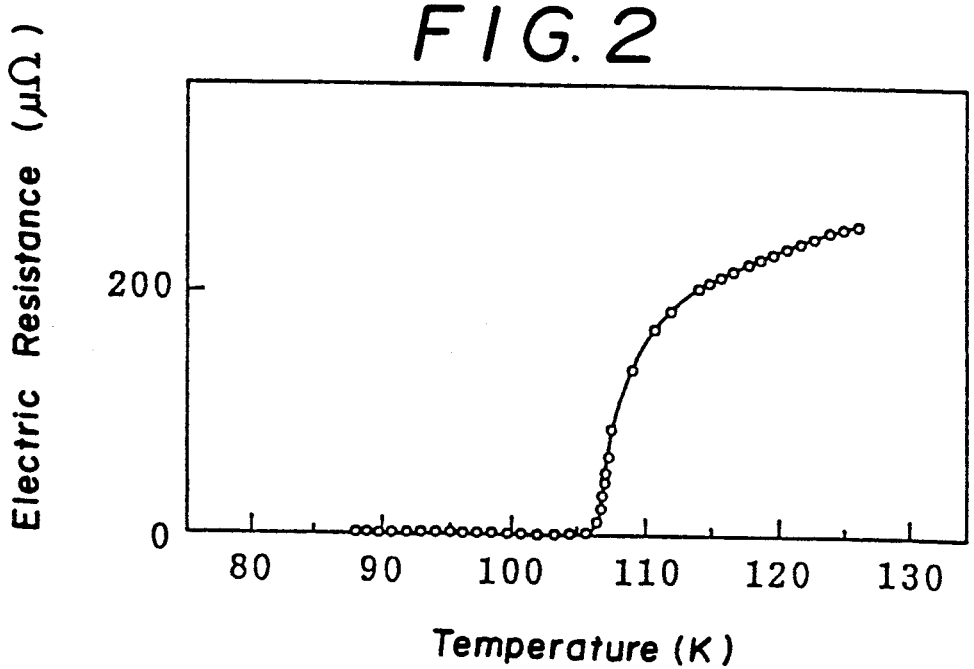

The Ac susceptibility change and the electric resistance change with temperature in the Example 3 in which the measurement was made by the application of the AC magnetization method and the four-probe resisting method are shown in FIGS. 1 and 2.

As is clear from the results shown in Table 2, those heat-treated at a sintering temperature of 845° C. showed a high critical temperature (Tc) of approximate 110K, a small transition (Tc) of from 3 to 4K and a critical current density (Jc) of about 700 A/cm$^2$, demonstrating the successful manufacture of a Bi—Sr—Ca—Cu—O system oxide superconductor having excellent superconducting properties.

EXAMPLE FOR COMPARISON

Pellets were formed from the same raw materials in the same manner as in the Examples 1 to 7, and were continuously sintered at 845° C. for eight days. A test piece was cut from each of the pellets for the measurement of the superconductivity in the same manner as in the Examples 1 to 7.

In these Examples, the respective value of the critical temperature (Tc) was lower by 2 to 3K as compared with Examples 1 to 7 and the maximum value of the critical current density (Jc) in liquid nitrogen was so low as 92 A/cm$^2$, with a superconductivity far inferior to those available in the Example 1 to 7.

EXAMPLES 8 to 10

The raw material powders, which are the same as those in the Examples 1 to 7, were prepared into the atomic ratio of Pb:Bi:Sr:Ca:Cu:=0.2:0.8:1.0:1.0:1.6 and were sufficiently mixed. The resultant powder was calcined at 800° C. in air for 10 hours and pressed to pellets 20 mm in diameter and 1 mm in thickness at a pressure of 16 ton/3.14 cm$^2$. The three pellets were formed in the same manner as above-mentioned. The pellets were sintered at 845° C. for 5 days in a reduced oxygen atmosphere with argon gas having an oxygen partial pressure of 1/13 atm. After initial sintering, the pellets were in the shape they were in pressurized and compressed under the same pressure 16 ton/3.14 cm$^2$ after cooling to room temperature. The pellets were subjected to an additional sintering at 845° C. for 1.5 hours (Example 8), for 5 hours (Example 9) and for 140 hours (Example 10), respectively.

A test piece was cut from the respective pellets obtained, and the critical current density was measured at 77K in a magnetic field from 0 to 1000 Oe. The results are shown in FIG. 3. In FIG. 3 the numerical values on each curve indicate the ration in thickness of the respective pellets before and after pressing.

As is clear from the results shown in FIG. 3, the magnetic field dependence of the critical current density (Jc) was considerably improved.

For the purpose of comparison with the above-mentioned Examples 8 to 10, a pellet was formed from the same raw materials in the same manner as in the Examples 8 to 10, and the pellet was sintered in the same manner. After the sintering, the pellet was not pressed and not subjected to the second sintering. The critical current density change of a test piece cut from thus obtained pellet was measured at the same 77K in the same magnetic field from 0 to 1000 Oe as in the Examples 8 to 10. The result is shown in FIG. 3, additionally.

As is clear from the comparison with the oxide superconductor in each of Examples 8 to 10 in FIG. 3, the critical current density of the oxide superconductor at 0 Oe in each of Examples 8 to 10 was greater than that of the unpressed test piece by more than one order of magnitude.

Furthermore, the decrease of the critical current density of the obtained oxide superconductor in each of Examples 8 to 10 with a magnetic field was in a better condition than that of the unpressed one, respectively.

The above shows the improvement of the critical current density of Bi—Sr—Ca—Cu—O system oxide superconductor by the intermediate pressing process.

What is claimed is:

1. A method for manufacturing an oxide high-temperature superconductor having a highly oriented microstructure comprising the steps of adding lead to a raw material powder containing bismuth, strontium, calcium, oxygen and copper; mixing said lead and raw powder material, calcining and forming the thus-produced mixture; sintering a resultant formed product; cooling said thus-sintered resultant formed product; working said sintered resultant formed product under pressure to compress said sintered resultant formed product into highly oriented crystalline grains in the direction of the c-axis thereof, and again sintering said thus worked sintered resultant formed product.

2. The method for manufacturing an oxide high-temperature superconductor as claimed in claim 1, wherein said raw material powder has an atomic ratio of Bi:Sr:Ca:Cu=from 0.6 to 1.0:1.0: from 1.0 to 1.5: from 1.5 to 2.5.

3. The method for manufacturing an oxide high-temperature superconductor as claimed in claim 1, wherein the amount of added lead is in an atomic ratio of from 0.05 to 1.0.

4. The method for manufacturing an oxide high-temperature superconductor as claimed in claim 1, wherein said sintering is carried out at a temperature within the range of from 780° to 890° C.

5. The method for manufacturing an oxide high-temperature superconductor as claimed in claim 1, wherein silver, silicon, boron, cadmium or sulfur is added to the raw material powder.

6. The method for manufacturing an oxide high-temperature superconductor as claimed in claim 1, wherein said mixture is formed into a pellet, a wire, a tape-shaped product or a thin film.

7. The method for manufacturing an oxide high-temperature superconductor as claimed in claim 1, wherein the process comprising sintering, working under pressure and sintering again is repeated.

8. The method for manufacturing an oxide high-temperature superconductor as claimed in claim 1, wherein the oxygen partial pressure during sintering is within the range of from 1 to 1/20 atm.

9. The method as claimed in claim 1 wherein said sintering steps are each carried out at 780° to 890° C.

10. The method as claimed in claim 9 wherein said sintering steps are each carried out for a period of one half a day to 20 days.

11. The method as claimed in claim 10 wherein said sintered resultant formed product is hot worked under a pressure ranging from a few tons to about 20 ton/3.14 cm$^2$.

12. The method as claimed in claim 11 wherein said hot working is carried out by pressing the sintered resultant formed product.

13. The method as claimed in claim 12 in which said hot working is carried out by a hot isostatic pressure (HIP) process.

* * * * *